United States Patent [19]

Gavaler

[11] 4,043,888
[45] Aug. 23, 1977

[54] SUPERCONDUCTIVE THIN FILMS HAVING TRANSITION TEMPERATURE SUBSTANTIALLY ABOVE THE BULK MATERIALS

[75] Inventor: John R. Gavaler, Pittsburgh, Pa.

[73] Assignee: Westinghouse Electric Corporation, Pittsburgh, Pa.

[21] Appl. No.: 609,137

[22] Filed: Aug. 29, 1975

Related U.S. Application Data

[63] Continuation-in-part of Ser. No. 383,625, July 30, 1973, abandoned.

[51] Int. Cl.² .................... C23C 15/00; C22C 27/02; H01F 7/22
[52] U.S. Cl. .................... 204/192 S; 75/174; 335/216; 427/62
[58] Field of Search .................... 204/192; 335/216; 75/174; 427/62, 63

[56] References Cited

U.S. PATENT DOCUMENTS

| | | | |
|---|---|---|---|
| 3,400,066 | 9/1968 | Caswell et al. | 204/192 |
| 3,420,763 | 1/1969 | Polito et al. | 204/192 |
| 3,506,940 | 4/1970 | Corenzwit et al. | 335/216 |
| 3,533,919 | 10/1970 | Prior | 204/192 X |
| 3,549,416 | 12/1970 | Rump et al. | 117/227 |
| 3,681,226 | 8/1972 | Vogel | 204/192 |
| 3,691,046 | 9/1972 | Okada et al. | 204/192 |
| 3,778,260 | 12/1973 | Kawabe et al. | 75/174 |

OTHER PUBLICATIONS

L. I. Maissel et al., "Handbook of Thin Film Technology", McGraw-Hill, N.Y., 1970, pp. 4-24, 4-25, 4-39.
R. W. Berry et al., "Thin Film Technology", Van Nostrand Reinhold, N.Y., 1968, p. 226.
J. J. Hanak et al., "Radio-Frequency Sputtered Films of B-Tungsten Structure Compounds", *J. Appl. Phys.*, vol. 41, Nov. 1970, pp. 4958-4962.
J. R. Gavaler et al., "Sputtering Techniques for Controlling Composition of Thin Films of High Tc. Superconducting Compounds", *J. Vac. Sci. Tech.*, vol. 8, pp. 180-183. 1971.

*Primary Examiner*—John H. Mack
*Assistant Examiner*—Aaron Weisstuch
*Attorney, Agent, or Firm*—R. T. Randig

[57] ABSTRACT

A sputtering technique is described in which a thin film superconductor is produced which exhibits a transition temperature in excess of the transition temperature of the bulk material. High gas pressures and low voltages are employed to produce $Nb_3Ge$ exhibiting $T_c$ of 22.3° K. The present invention was made in and during the course of work under DOD contract No. F 44-620-71-C-0045.

14 Claims, No Drawings

SUPERCONDUCTIVE THIN FILMS HAVING TRANSITION TEMPERATURE SUBSTANTIALLY ABOVE THE BULK MATERIALS

CROSS REFERENCE TO THE RELATED APPLICATION

The present application is a continuation-in-part of application Ser. No. 383,625 filed July 30, 1973, now abandoned and is closely related to application Ser. No. 271,884 filed July 14, 1972, now abandoned in favor of application Ser. No. 398,902 which has issued and is identified as U.S. Pat. No. 3,912,612.

BACKGROUND OF THE INVENTION

1. Field of the Invention

The present invention is particularly concerned with superconductor compositions and in particular those superconductor compositions which are known as Type II. Of the Type II compositions those which exhibit the highest transition temperature have a particular type of crystallographic structure known as A-15 or as the beta-wolfram structure. By employing the thin film sputtering techniques of this invention for producing the desired stoichiometry, superconducting transition temperatures as high as 22.3° K have been observed in $Nb_3Ge$.

2. Description of the Prior Art

The most favorable crystal structure for high transition temperatures has been found to be the A-15 or the beta-wolfram structure. Among the many binary systems which exhibit this crystal structure is the niobium-germanium system. Examples of the beta-wolfram structure of niobium-germanium using standard metallurgical techniques were prepared and were found to have a transition temperature of about 6° K. Through the use of the standard metallurgical techniques, it was discovered that such compositions were slightly off the stoichiometry from the desired composition of $Nb_3Ge$. Based on these and other considerations it was hypothesized that if the stoichiometric $Nb_3Ge$ could be formed it would have a very high transition temperature. Some experimental verification for this hypothesis was found when it was shown that by splat cooling the molten material of the proper composition a more nearly stoichiometric compound was produced. When such material was tested for its superconductivity, transition temperatures of about 17° K were found.

As a result of this type of early work and later theoretical considerations, a thesis has been presented which is presently gaining wide acceptance in that it is believed that all high transition temperature superconductors are inherently structurally unstable, that is, the same factors which would produce a high transition temperature in these compounds also produces structural instabilities. If this theory is accepted, it is apparent that materials which might be expected to have very high transition temperatures if they could be made to crystallize into a structure most conducive to the high temperature superconductivity will not normally do so using standard preparation techniques.

Based on this reasoning the achievement of high transition temperatures must be dependent on the development of new techniques capable of fabricating materials with the desired crystal structures in metastable form. If successful, these materials with metastable crystal structures could in some instances be expected to possess very high transition temperatures. This has lead to the investigation of various thin film techniques such as sputtering, evaporation, and chemical vapor deposition which in the past have demonstrated the ability to produce metastable structures. As a result, sputtering techniques to produce niobium-germanium have been reported with the maximum transition temperature of 16.5° K thereby indicating that the material is close to the desired stoichiometry.

In U.S. Pat. No. 3,506,940 to E. Corenzwit et al, there is reported a method of critically annealing pseudo-binary compositions of niobium-germanium-aluminum which showed improved transition temperatures irrespective of the technique used for the formation of the pseudo-binary composition. However, the highest superconducting temperature reported therein was 20.1° K.

By following the parameters of the present invention, the critical annealing step is not mandatory yet a higher transition temperature, namely 22.3° K has been reproducibly obtained.

SUMMARY OF THE INVENTION

The present invention relates to a method of producing thin films of superconductor materials of the beta-wolfram type having high transition temperatures. A sputtering technique is employed wherein the components which ultimately form the thin film are assembled within a closed reactor together with a suitable substrate material. At least two components are employed which have been termed target materials and which ultimately react with one another during the sputtering process to form the beta-wolfram type crystallographic structure having the desired stoichiometry.

When the target materials and the substrate are suitably positioned within the closed reactor, it is evacuated to a pressure not in excess of $10^{-10}$ Torr and the components are heated under such low pressure conditions in order to remove all of the volatile impurities. Thereafter an inert gas is admitted to the reactor and the pressure within the reactor is adjusted to a range between about 200 and about 600 microns. Thereafter the substrate is heated to a temperature not in excess of 1000° C following which the components within the reactor are connected to a source of DC power. The voltage is adjusted to a value within range between about 600 and about 1000 volts and the cathode current density is adjusted to a range within between about 10 and about 50 milliamperes per square inch of cathode surface. The sputtering is continued until the desired film thickness on the substrate is obtained and thereafter the substrate and film are quenched to room temperature.

By following the reaction parameters as set forth hereinbefore, it has been found that superconducting thin films may be reproducibly obtained which exhibit a transition temperature of at least 4° K higher than that of the bulk material having substantially the same gross stoichiometry. X-ray data on actual samples of beta-wolfram type niobium-germanium films has indicated a lattice parameter value of 5.15 ± 0.01 A units.

DESCRIPTION OF THE PREFERRED EMBODIMENT

In practicing the method of the present invention, the apparatus which is described in the cross-referenced related U.S. Pat. No. 3,912,612 can be employed in practicing the method of the present invention in contrast to the method set forth therein. The most important features of the present invention include the use of relatively low sputtering voltages and high sputtering gas pressures.

Essentially the method consists of placing within a closed reactor a suitable substrate material upon which the thin films may be sputtered under the conditions set forth hereinafter. Reproducible results have been achieved on a substrate material comprising a ceramic such as alumina and beryllia.

The cathode comprises a composite target material which may be made by partially covering the one component with the other so that half of the exposed surface is the one component of the thin film and the other half is the other half of the thin film. For example, where it is desired to deposit a thin film of $Nb_3Ge$ a slice of germanium is partially covered with a piece of niobium sheet so that half of the exposed surface area is niobium and the other half is germanium. While the amount of the coverage is not critical, nonetheless there must be a partial exposure of each component which is desired in the sputtered thin film. Thus for example if the thin film is the ternary composition niobium-aluminum-germanium then equal area exposed portions of the target material should be niobium, aluminum and germanium. It will of course be appreciated that other methods of preparing the target material can be employed that will enable the intimate mixing of the components, the easy removal of volatile impurities and provide the shortest mean free path.

In preparing the cathode to accomplish the above requirements other techniques may also be employed. For example, stoichiometric quantities of the desired thin film composition may be combined by blending in the familiar powder metallurgical technique. The blended components are pressed to the desired cathode configuration and then sintered under suitable conditions of temperature and atmosphere so that the volatile impurities are removed either prior to practicing the method of this invention or during the practicing of the method of this invention. Alternatively, stoichiometric amounts of the components of the desired thin film composition may be melted followed by casting into the desired cathode configuration or the cast product can be comminuted and the powder metallurgical route followed, as set forth hereinabove.

This cathode is suitably connected to a source of DC power in the same manner as described in U.S. Pat. No. 3,912,612. The cathode and anode materials are assembled within their reactor in spaced relation to one another it having been found that a distance of up to about 4 inches is sufficient for obtaining the desired film stoichiometry within the deposited film. As these components are assembled within the closed reactor, the reactor is thereafter evacuated until the absolute pressure within the reactor is less than about $10^{-10}$ Torr, typically about $5 \times 10^{-10}$ Torr. With this sort of background pressure the temperature of the components contained within the reactor is raised preferably to a temperature within the range between about 300° C and about 400° C. Such temperature and background pressures are maintained for a time period of about 8 to about 24 hours in duration. By evacuating the reactor to such a low pressure and by heating the components within the reactor, a high purity environment is assured since all volatilizable impurities will be removed.

With this high purity environment achieved, it is next preferred to introduce into the reactor an inert gas, that is, a gas which is inert and non-reactive with or to the components contained within the reactor and which gas will support sputtering to provide the plasma necessary for the transfer of the target materials to the substrate. While all of the noble gases are operative, it is preferred to use argon. In contrast to previous work, it has now been found that the inert gas which is admitted to the reactor preferably has its pressure adjusted so that the pressure within the reactor will be within the range between about 200 and about 600 microns in order to obtain reproducible results. In most of the experiments performed argon has been the preferred inert gas since it will not react with any of the components within the reactor nor with any of the materials of which the reactor is made yet it will supply the necessary plasma to sustain the thin film transfer of the components to the substrate in the desired stoichiometrical ratio.

With the inert gas pressure regulated to the value set forth hereinbefore, the substrate is then heated to a temperature not in excess of about 1000° C. While substantially lower temperatures can be used and temperatures as low as those of liquid nitrogen can be employed where other suitable precautions are taken, as will be set forth hereinafter, best results have been secured with the substrate at a temperature within the range between about 700° C and about 950° C.

With the substrate heated to this temperature the substrate and target components within the reactor are connected to a source of DC power with the substrate being the anode and the target being the cathode and said DC power is regulated by controlling the voltage to a value within the range between about 600 and about 1000 volts and the cathode current density is regulated to a range within about 10 and about 50 milliamps per square inch. Employing these conditions sputtering will take place wherein the target materials are transferred to the substrate. It is believed that the mean free path of the target materials is reduced in the sputtering plasma due to the high concentration of argon so that a better mixing occurs on an atomic basis so that when the components are deposited on the substrate they may assume the beta-wolfram type crystallographic structure on the substrate with the desired stoichiometrical ratio.

In practice it has been found that continuing the sputtering under the aforesaid conditions for a period of 2 hours results in the deposition of a thin film of the desired stoichiometrical composition having the beta-wolfram structure and of a thickness of about 1 micron. Longer time periods can be employed to produce thicker films and shorter time periods can be employed for producing thinner films, it is preferred to retain the voltage and current density characteristics within the aforesaid ranges throughout this time period in order that the desired stoichiometry of the sputtered deposit will be obtained and to such a degree on an atomic basis that the deposited thin film will exhibit a transition temperature which is at least 4° K higher than that of comparable bulk materials having the desired gross stoichiometry although it appears that for the bulk materials it is not on an atomic basis such as is possible employing the method of the present invention.

After the desired thickness is obtained the film is quenched to room temperature and this is usually accomplished simply by interrupting the electrical current which is customarily utilized for heating the substrate material to the desired temperature range.

In order to more clearly demonstrate the method of the present invention reference may be had to the following example. A substrate consisting of high purity $Al_2O_3$ was pressed and sintered and assembled as the substrate in a reactor upon a resistance heated plate in spaced relation to the target material which latter comprised a slice of germanium which was partially covered with a niobium sheet so that half of the exposed target surface was niobium and the other half was germanium. The target material was separated from the substrate by approximately 1 inch and thereafter the assembled components within the reactor were evacuated until the pressure within the reactor was reduced to a value of $5 \times 10^{-10}$ Torr. At this point the substrate heater was energized and the temperature of the alumina substrate raised to 400° C and remained at this temperature for a 16 hour bake-out. Thereafter, argon was admitted to the closed container and the gas pressure within the container was regulated to a value of 300 microns. The substrate heater was then energized and the temperature of the substrate was raised to 950° C at which point the substrate was made the anode and the target the cathode by connection to a source of DC power and the voltage was regulated to a value of 750 volts. The corresponding current density was controlled to between 10 and 20 milliamps per square inch of target material. The sputtering was continued for a period of 2 hours at which point the DC power was disconnected and at the same time the current to the substrate heater was also disconnected thereby quenching the material to room temperature in less than one minute. When removed from the container the thin film was found to be of a thickness of about 1 micron.

The transition temperatures of the niobium-germanium film were measured using a standard four point resistive technique with the temperature being determined by a gas bulb thermometer. As thus prepared the niobium-germanium film had a maximum transition temperature of 22.3° K a midpoint of about 21.5° K and became completely superconducting at 20.8° K. In addition some critical current and field measurement were performed on such niobium-germanium films having the high transition temperatures. These temperatures were done in liquid hydrogen at 20° K. The films in these experiments were mounted so that the direction of the field was normal to the current and to the plane of the film.

Using the criterion that $H_c$ is that field at which the material has regained 10% of its normal state resistivity a maximum $H_{c2}$ value of 37 kilogauss was found. At zero field operating under a similar criterion, current densitites of over $10^4$ amps per square centimeter were also measured.

A film with the high transition temperature was also subjected to X-ray defraction analysis. The predominant phase was found to be the beta-wolfram structure with the lattice parameter of $5.15 \pm$ A units. It was also found during such X-ray analysis that a very minute amount of another phase was also found which has a structure similar to $Nb_5Ge_3$ phase found in bulk samples. Annealing of these films at temperatures of 700° to 750° C for times of up to 24 hours in general produce no significant changes in the transition temperature either up or down. However, in one case where the film exhibited a large amount of the $Nb_5Ge_3$ phase annealing resulted in a sharp decrease in the transition temperature. While this film which initially had an onset temperature of 21.4° K, a midpoint of 20.8° K and was completely superconducting at 20.3° K was heated for 24 hours at 750° C. After this anneal the film showed a very broad transition starting at 16° K and extending down to less than 4.2° K. Analysis of this film showed that it has transformed almost totally into a $Nb_5Ge_3$ structure with only a very faint trace of the beta-wolfram second phase still remaining.

It has been postulated that the very high transition temperatures witnessed in the present niobium-germanium sputtered films produced by the method of the present invention are due to the formation of a more nearly perfect stoichiometric $Nb_3Ge$ compound in these films than has been obtainable in the previous bulk or thin film samples. It is believed that this results from the fact that there is a more intimate mixing and the formation of the beta-wolfram structure on an atomic basis during such sputtering technique as opposed to a bulk-material which may have the proper gross stoichiometry but not necessarily on an atomic basis. Thus by the practice of the present invention, it is believed that the present films are more crystallographically ordered than in the bulk samples produced by other methods.

As thus described the method of the present invention requires as a minimum that the sputtering must be done in a high purity environment to eliminate residual gas contamination during the present process. If other methods of obtaining the high purity requirements are found, they may be substituted and when combined with the low voltages and high gas pressures which are employed in the present invention similar results may be obtained.

Moreover, the process is also applicable for depositing thin films of other materials which may not be superconducting but which require a more near-perfect stoichiometry. Such materials find wide usage in the electronics industry.

Thus, the process of the present invention is useful in making thin films of those materials which have application as "magnetic bubbles". These materials require a rigid control of the stoichiometry. Such materials include Gadolinium-Iron and Gadolinium-Chromium.

As stated previously it is preferred to heat the substrate to a temperature within the range between about 700° C and 950° C during sputtering. It has been found, however, that lower temperatures can be employed if, following deposition upon the substrate the film is thereafter annealed. Thus, equivalent results were obtained where the substrate was maintained at a temperature of 200° C and thereafter the film was annealed at a temperature within the range between 600° C and 1000° C and preferably at a temperature of 750° C $\pm$ 50° C.

I claim:

1. In a method of producing thin films of superconductor materials of the beta-wolfram type having high transition temperatures, the steps comprising (a) assembling within a closed reactor a substrate and a composite containing at least two target materials which when reacted are capable of forming the beta-wolfram crystallographic structure, (b) evacuating the reactor to a pressure not in excess of $5 \times 10^{-10}$ Torr while heating the components contained within the reactor to remove all volatile impurities therefrom under said conditions, (c) admitting an inert gas which will support sputtering to the reactor and adjusting the pressure within the reactor with said inert gas to the range between about 2 and $6 \times 10^{-1}$ Torr, (d) heating the substrate to a temperature not in excess of about 1000° C, (e) connecting the components within the reactor to a source of DC power while controlling the voltage within the range between about 600 and about 1000 volts and the cathode current density within the range between about 10 and about 50 milliamps per square inch, (f) continuing said sputtering until the desired film thickness is obtained on the substrate, said film having the beta-wolfram structure, and (g) thereafter quenching the deposited film to room temperature.

2. The method of claim 1, in which the inert gas is argon.

3. The method of claim 1, in which the target materials are niobium and germanium.

4. The method of claim 1, in which the voltage is within the range between about 700 and about 900 volts.

5. The method of claim 1, in which the cathode current density is within the range between about 10 and about 20 milliamps per square inch.

6. The method of claim 1, in which the substrate is maintained at a temperature within the range between about 700° C and about 950° C.

7. The method of claim 1, in which the substrate is maintained at a temperature not in excess of 700° C, the additional step of annealing the quenched film at a temperature within the range between 700° C and 1000° C.

8. The method of claim 1, in which the quenched film is annealed at a temperature within the range between about 750° C and about 1000° C.

9. An elongated superconducting body having a transition temperature of about 22° K formed of a plurality of turns containing the composition $Nb_3Ge$, said $Nb_3Ge$ having been deposited by the method of claim 1.

10. In the method of producing a thin film superconductor having a transition temperature of about 22° K, the steps comprising (a) assembling in spaced relation within a closed reactor a substrate and a composite containing niobium and germanium target materials, (b) evacuating the reactor to a pressure not in excess of $10^{-10}$ Torr while heating the components contained within the reactor to remove the volatile impurities therefrom, (c) admitting argon to the reactor and adjusting the pressure of argon within the reactor to a value within the range between about 3 and about 6 × $10^{-1}$ Torr, (d) heating the substrate to a temperature within the range between about 750° C and about 950° C, (e) connecting the components within the reactor to a source of DC power wherein the voltage is within the range between about 600 and about 900 volts and a corresponding cathode current density within the range between about 3 and 5 milliamperes per square centimeter, (f) continuing the sputtering until a $Nb_3Ge$ film is deposited on the substrate of about 1 micron in thickness, and (g) quenching the film to room temperature.

11. The method of claim 10, in which the space between the substrate and the target materials is maintained ithin the range between about 1 and about 4 centimeters.

12. A thin film Type II superconductor of niobium-germanium said film having a beta-wolfram crystallographic structure of the required stoichiometry and a transition temperature at least 4 Kelvin degrees higher than the bulk material of the same gross stoichiometry.

13. The superconductor of claim 11, in which the ratio of niobium to germanium is 3 to 1.

14. In a method of producing thin films of materials requiring predetermined stoichiometry, the steps comprising, in sequence, (a) assembling within a closed reactor a substrate and a composite containing at least two materials for forming a predetermined composition which materials, when reacted, form the predetermined stoichiometrical composition (b) evacuating the reactor to a vacuum of at least $5 \times 10^{-10}$ Torr while heating the components contained within the reactor to remove all volatile impurities therefrom, (c) admitting an inert gas to the reactor and adjusting the pressure within the reactor with said inert gas to a range between 2 and 6 × $10^{-1}$ Torr (d) heating the substrate to a temperature not in excess of about 1000° C (e) connecting the components within the reactor to a source of DC power while controlling the voltage within the range between about 600 to about 1000 volts and the cathode current density within the range between about 10 and about 50 milliamps per square inch to effect sputter deposition of a thin film of the predetermined stoichiometry on the substrate (f) continuing said sputter deposition until the desired film thickness on the substrate, is obtained, and (g) thereafter quenching the deposited film to room temperature.

* * * * *